(12) United States Patent
Brandenburg et al.

(10) Patent No.: US 7,134,194 B2
(45) Date of Patent: Nov. 14, 2006

(54) METHOD OF DEVELOPING AN ELECTRONIC MODULE

(75) Inventors: Scott D. Brandenburg, Kokomo, IN (US); Todd P. Oman, Greentown, IN (US); Micheal E. Miller, Rossville, IN (US)

(73) Assignee: Delphi Technologies, Inc., Troy, MI (US)

( * ) Notice: Subject to any disclaimer, the term of this patent is extended or adjusted under 35 U.S.C. 154(b) by 334 days.

(21) Appl. No.: 10/707,004

(22) Filed: Nov. 13, 2003

(65) Prior Publication Data

US 2005/0105281 A1 May 19, 2005

(51) Int. Cl.
*H05K 3/30* (2006.01)

(52) U.S. Cl. .............................. 29/832; 29/825; 29/829; 29/830; 29/831; 29/845; 29/848; 257/686; 257/778; 257/E25.023; 264/263; 264/272.15; 361/749; 361/796; 361/803

(58) Field of Classification Search ................. 29/825, 29/829–832, 846, 848; 257/686, 778, E25.023; 264/263, 272.15; 361/749, 796, 803
See application file for complete search history.

(56) References Cited

U.S. PATENT DOCUMENTS

| | | | |
|---|---|---|---|
| 5,198,965 A | 3/1993 | Curtis et al. | |
| 6,180,045 B1* | 1/2001 | Brandenburg et al. | 264/263 |
| 6,285,551 B1 | 9/2001 | Brandenburg et al. | |
| 6,410,983 B1 | 6/2002 | Moriizumi et al. | |
| 6,444,921 B1 | 9/2003 | Wang et al. | |
| 6,636,825 B1 | 10/2003 | Malladi et al. | 702/118 |
| 2002/0105068 A1* | 8/2002 | Fukumoto et al. | 257/686 |
| 2003/0080438 A1 | 5/2003 | Matsuura et al. | |

FOREIGN PATENT DOCUMENTS

| | | |
|---|---|---|
| DE | 197 16 946 | 10/1998 |
| EP | 0 065 425 | 11/1982 |
| EP | 0 571 749 | 12/1993 |
| EP | 0 683 450 | 11/1995 |

OTHER PUBLICATIONS

European Search Report dated Feb. 7, 2005.

* cited by examiner

*Primary Examiner*—A. Dexter Tugbang
*Assistant Examiner*—Tim Phan
(74) *Attorney, Agent, or Firm*—Jimmy L. Funke

(57) ABSTRACT

An electronic module and method that enable circuitry required by one form of the module (e.g., a developmental unit) to be omitted in a second form of the module (e.g., a production unit), without necessitating additional changes in the module. The electronic module includes a motherboard, a multichip module (MCM) mounted to the motherboard, and a circuit unit connected to the MCM. The circuit unit comprises a flexible substrate, instrumentation circuitry mounted on the flexible substrate, and a connector coupled to the flexible substrate. The flexible substrate has signal lines that electrically communicate with the MCM, the instrumentation circuitry, and the connector. A portion of the flexible substrate is located between the MCM and the motherboard and permits electrical communication therebetween. The instrumentation circuitry does not occupy space on the motherboard.

10 Claims, 4 Drawing Sheets

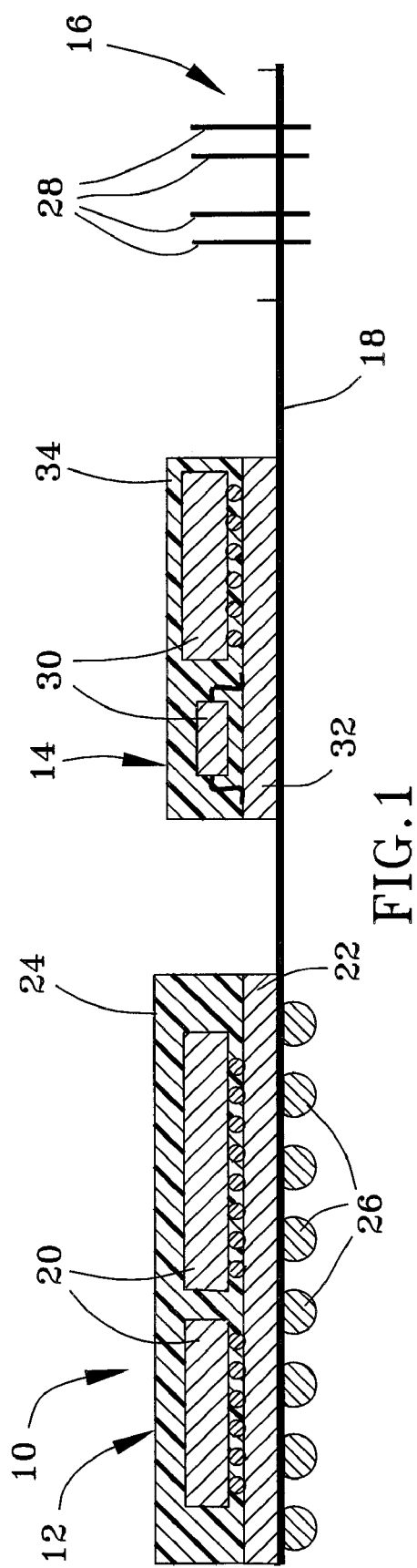
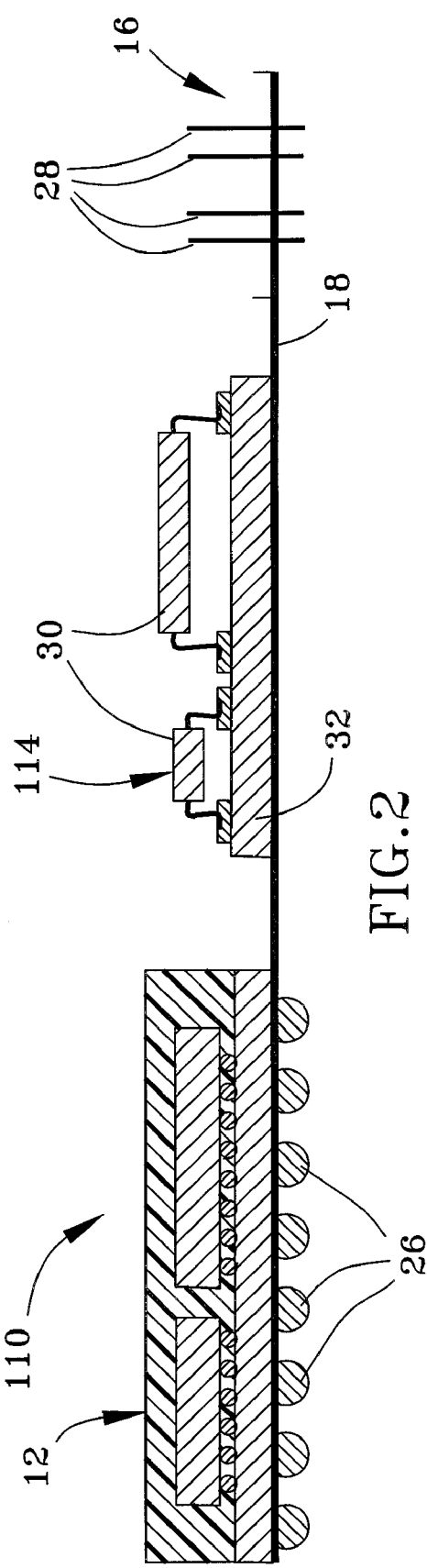
FIG. 1
FIG. 2

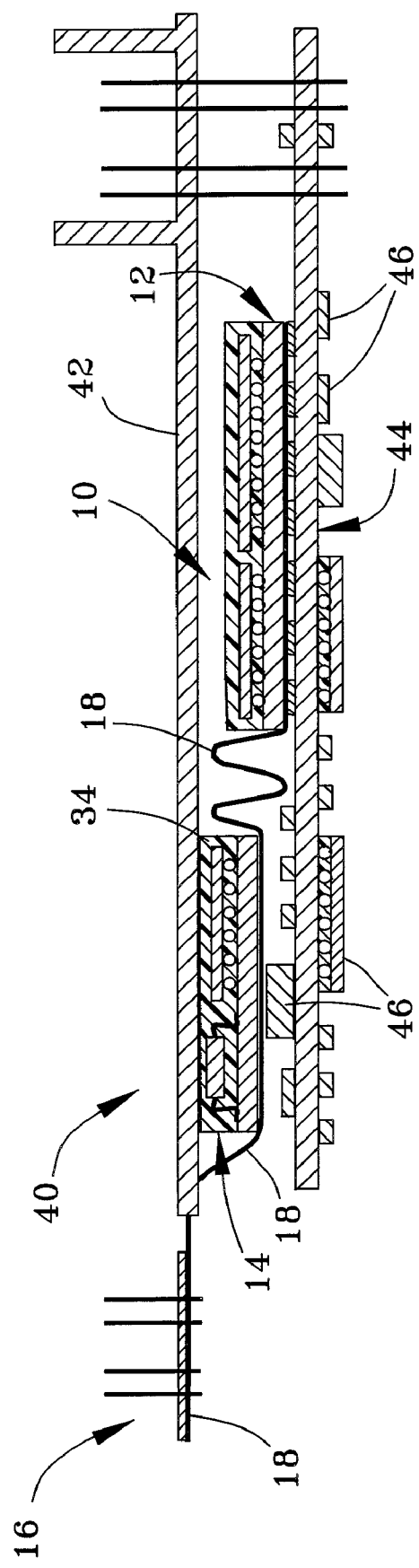
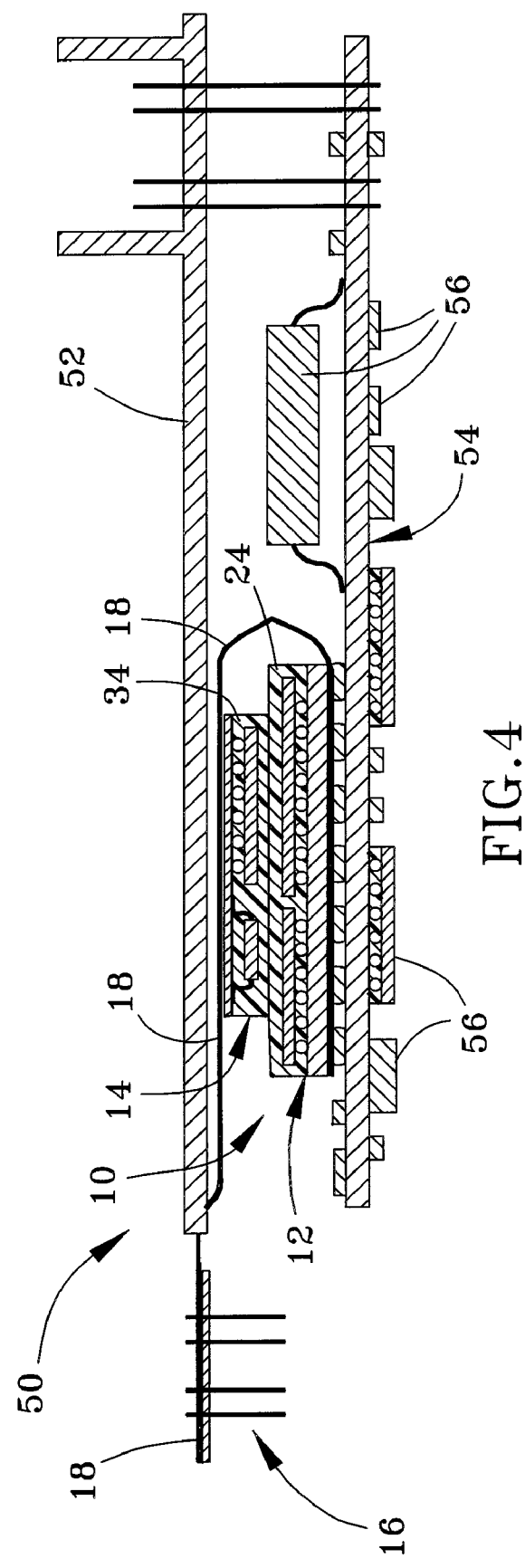
FIG. 3
FIG. 4

METHOD OF DEVELOPING AN ELECTRONIC MODULE

BACKGROUND OF INVENTION

1. Field of the Invention

The present invention generally relates to circuit device packages. More particularly, this invention relates to circuit modules that require circuitry during development of the module that is later unneeded in production units of the module, wherein the circuitry is mounted on a flexible circuit that permits removal of the circuitry from the module without otherwise requiring modifications to the module.

2. Description of the Related Art

The continuous effort to reduce the size of circuit board assemblies has promoted the use of advanced packaging technologies such as multichip modules (MCM), including ball grid arrays (BGA). Circuit devices, typically surface-mount technology (SMT) components, are attached with solder to a chip carrier, often a laminate substrate such as a high-density printed circuit board (PCB). The solder may be initially present in the form of solder bumps that are formed on the devices and then reflowed to form solder joint connections that attach the devices to the chip carrier. In the case where the chip carrier is a PCB, it is usually desirable to underfill any flip chips on the chip carrier with a filled epoxy to ensure the reliability of the solder joint connections. The resulting MCM may be overmolded before being mounted to a motherboard, such as by reflowing solder bumps formed on the lower surface of the chip carrier. Finally, the motherboard assembly may be overmolded to protectively encase the MCM as well as any other MCM's or other circuit components mounted to the motherboard.

An example of an application for MCM's as described above is powertrain control modules (PCM's) for automotive applications. Instrumentation circuitry is often included in PCM's for emulation carried out during development and qualification of the PCM to assess the performance of an MCM mounted thereto. Current instrumentation techniques may require a calibration random access memory integrated circuit (RAM IC), a controller area network (CAN) IC, a connector with multiple signal lines, and supporting circuitry, all of which must be accommodated on the motherboard. Where practice prohibits altering a PCM design or its motherboard layout after qualification, the area on a PCM motherboard for the instrumentation circuitry must be carried on production PCM units long after there is any need for the instrumentation circuitry. The result is wasted motherboard real estate, increased cost, and the potential for noise generated because of the open signal lines of the instrumentation circuitry connector.

In view of the above, it can be appreciated that it would be desirable to eliminate the need to accommodate instrumentation circuitry on production units of a PCM motherboard and other motherboards on which MCM's are mounted.

SUMMARY OF INVENTION

The present invention is directed to an electronic module and method that enable circuitry required by one form of the module (e.g., a developmental unit of the module) to be omitted in a second form of the module (e.g., a production unit of the module), without necessitating additional changes in the module. Such a capability permits the development of an electronic module requiring instrumentation circuitry, and the subsequent omission of the instrumentation circuitry from the production configuration of the electronic module without requiring any other alterations to the electronic module.

An electronic module in accordance with the present invention generally includes a motherboard, an MCM mounted to the motherboard and a circuit unit connected to the MCM. The circuit unit comprises a flexible substrate, instrumentation circuitry mounted on the flexible substrate, and a connector coupled to the flexible substrate. The flexible substrate has signal lines for electrical communication between the MCM, the instrumentation circuitry, and the connector. A portion of the flexible substrate is located between the MCM and the motherboard and permits electrical communication therebetween. The instrumentation circuitry is not mounted directly to the motherboard so as not to require space on the motherboard, and the circuit unit can be eliminated from the electronic module without requiring any alteration of the motherboard.

In view of the above, the invention enables a method by which production units of the electronic module can be produced with motherboards and MCM's that are identical to those of a developmental unit of the module. The developmental unit is produced to include the motherboard, the MCM, and the circuit unit connected to the MCM, as described above. As such, the circuit unit includes the flexible substrate, instrumentation circuitry mounted on the flexible substrate, and connector coupled to the flexible substrate, and during assembly of the developmental unit a portion of the flexible circuit is positioned between the MCM and the motherboard yet permits electrical communication therebetween. Again, the instrumentation circuitry is not mounted directly to the motherboard so as not to require space on the motherboard. Subsequently, the production unit of the electronic module can be produced by eliminating the circuit unit, including the flexible substrate, instrumentation circuitry, and connector, without otherwise requiring any alterations to the electronic module or its motherboard.

From the above, it can be seen that the present invention enables instrumentation circuitry for an MCM to be incorporated into an electronic module containing the MCM for development purposes, without the requirement to accommodate the instrumentation circuitry on the surface of the motherboard to which the module is mounted. Thereafter, the instrumentation circuitry can be completely eliminated from the electronic module without changing the design or layout of the motherboard. As such, valuable real estate on the motherboard is not lost to circuitry that, while necessary during development of the module, is not required in the final production unit of the module. Furthermore, the present invention eliminates any risk of performance degradation resulting from the presence of such circuitry, and particularly the signal lines of the flexible substrate, within the production unit.

Other objects and advantages of this invention will be better appreciated from the following detailed description.

BRIEF DESCRIPTION OF DRAWINGS

FIGS. 1 and 2 represent two configurations for a combined MCM and circuit unit that includes a flexible substrate on which the MCM and instrumentation circuitry are mounted, the latter of which is for use in a developmental unit of an electronic module in accordance with the present invention.

FIGS. 3, 4, 5 and 6 show the combined MCM and circuit unit of FIG. 1 incorporated into developmental units of electronic modules in accordance with different embodiments of this invention.

DETAILED DESCRIPTION

Figure 5:
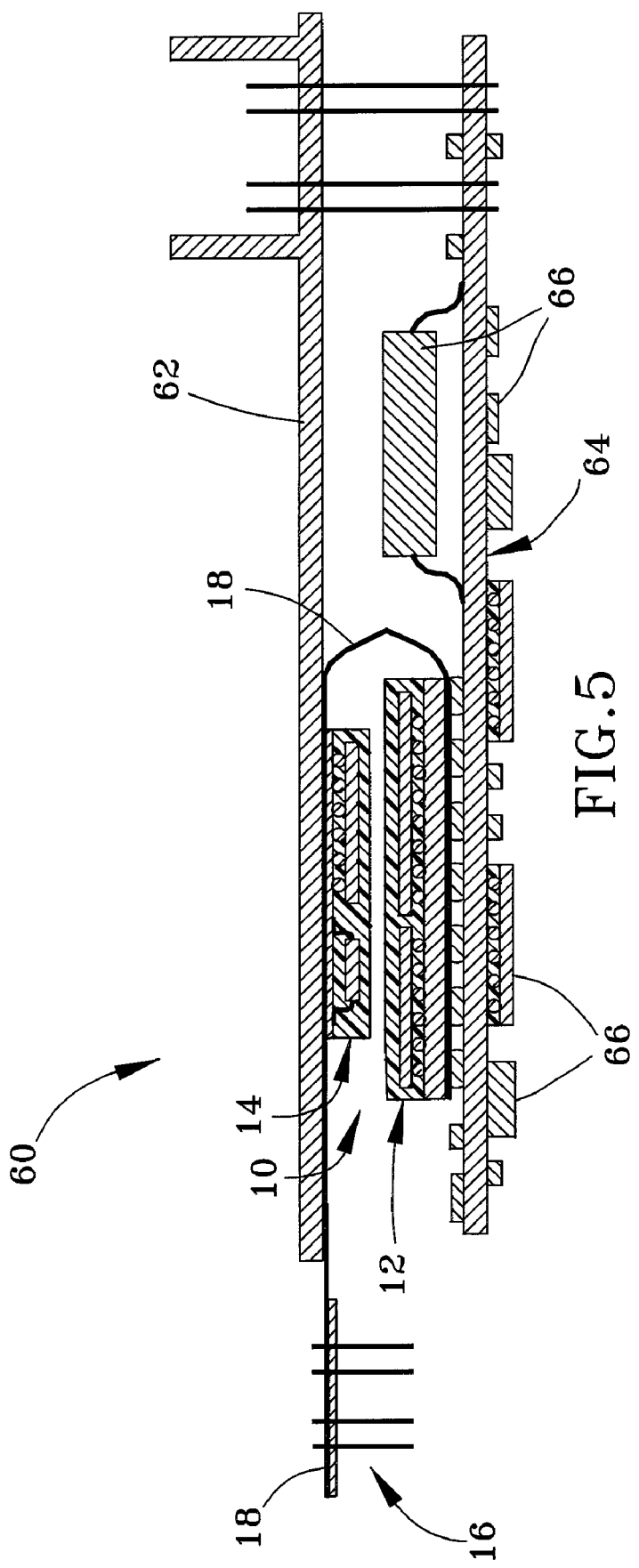

FIGS. 1 and 2 represent circuit units 10 and 110 in accordance with two embodiments of this invention. Each unit 10 and 110 is shown as including a multichip module (MCM) 12, an instrumentation module 14 or 114, a connector 16, and a flexible circuit 18. While the units 10 and 110 are depicted as comprising only one of each of the MCM 12 and instrumentation module 14 or 114, any number of these modules could be mounted to one or more flexible circuits 18 for the purpose of obtaining the benefits of this invention.

The MCM 12 and instrumentation module 14 and 114 are mounted to the flexible circuit 18, which is preferably a flexible circuit. As known in the art, a flexible circuit (also referred to as a flex circuit) is a flexible substrate of an electrically insulating material such as a polyimide or polyester film, often in the form of a flat cable, with parallel conductors (signal lines) along its length. The present invention utilizes the flexible circuit 18 as a substrate for removably incorporating the instrumentation module 14 within a circuit module, such as any of the modules represented in FIGS. 3 through 6, as well as various other types of circuit assemblies. The signal lines (not shown) within the flexible circuit 18 enable electrical communication between the MCM 12, instrumentation module 14 or 114, and connector 16, the latter of which comprises any suitable number of pins 28 for transmitting the required electrical communications.

The MCM 12 is depicted as a ball grid array (BGA) comprising two flip chips 20 on a substrate 22 (such as a laminate PCB) encased in an overmolding 24, though other constructions could be used. The lower surface of the substrate 22 is laminated or otherwise attached to the flexible circuit 18. The MCM 12 can be electrically connected to the signal lines of the flexible circuit 18 through plated through-holes in the circuit 18 or with an anisotropic conductive adhesive (ACA). Finally, the MCM 12 is equipped with solder bumps 26 that permit reflow soldering of the MCM 12 to a motherboard (e.g., one of the motherboards depicted in FIGS. 3 through 7). In addition to providing electrical connection of the signal lines with the MCM 12, that portion of the flexible circuit 18 laminated to the MCM 12 is also configured with openings or plated through-holes (not shown) to provide electrical communication between the MCM 12 and its solder bumps 26.

The circuit units 10 and 110 are represented as being essentially identical except for the configuration of the instrumentation modules 14 and 114. Each instrumentation module 14 and 114 comprises circuit devices 30 (e.g., flip chips, packaged IC's, SM components, etc.) on a substrate 32 (such as a printed circuit board) that may be laminated to the flexible circuit 18. In FIG. 1, the substrate 32, its circuit devices 30, and that portion of the flexible circuit 18 to which the substrate 32 is attached are encased within in overmolding 34, allowing for a relative small, rugged package. The embodiment of FIG. 2 differs from FIG. 1 in that the module 114 of FIG. 2 is not overmolded. In each embodiment, the substrate 32 could be omitted and the devices 30 mounted directly to the flexible circuit 18.

FIG. 3 shows a portion of a module 40, including a case 42 in which the circuit unit 10 of FIG. 1 is installed, along with a motherboard 44. The motherboard 44 may have any suitable construction, such as a laminate PCB. The MCM 12 is shown as having been reflow soldered to the motherboard 44 in accordance with known practices, with the result that a portion of the flexible circuit 18 is sandwiched between the MCM 12 and the motherboard 44, though permitting the solder connections to provide electrical communication therebetween. The opposing surfaces of the motherboard 44 are shown as being populated with other circuit devices 46 as necessary for the intended application, for example a powertrain control module (PCM). As evident from FIG. 3, in regard to the circuit unit 10, only the MCM 12 consumes any surface area of the motherboard 44. The instrumentation module 14 is attached directly to the interior of the case 42, with the overmolding 34 of the module 14 bonded or otherwise attached to the case 42. As such, the module 14 is suspended above and spaced apart from the motherboard 44 and its circuit devices 46. Because the flexible circuit 18 provides electrical connection between the MCM 12, instrumentation module 14 and connector 16, the module 40 is configured as a developmental unit that can undergo testing through the use of suitable emulation circuitry (EMU) connected to the MCM 12 through the connector 16, which is shown supported outside the case 42 by the flexible circuit 18. As evident from FIG. 3, the instrumentation module 14, connector 16, and flexible circuit 18 can be eliminated from the module 40 simply by mounting an MCM that is identical to the MCM 12 of FIGS. 1 and 3, but without the flexible circuit 18 and its attached module 14 and connector 16. In this manner, both developmental and production units of the module 40 can be manufactured with identical motherboards 44.

In FIG. 4, a portion of a module 50 is shown that differs from the module 40 of FIG. 3 only by the fact that the instrumentation module 14 is directly attached to the topside of the MCM 12, instead of the interior of the case 52, e.g., the overmolding 34 of the module 14 is bonded to the overmolding 24 of the MCM 12. As such, the instrumentation module 14 again does not occupy any space on the motherboard 54, such that both developmental and production units of the module 50 can be manufactured with identical motherboards 54.

FIG. 5 illustrates another embodiment of the invention, in which a portion of a module 60 is shown that differs from the modules 40 and 50 of FIGS. 3 and 4 as a result of the instrumentation module 14 being indirectly attached to the interior of the case 62 with the flexible circuit 18. In this configuration, the instrumentation module 14 is adjacent but spaced apart from the topside of the MCM 12, as well as the motherboard 64 and its circuit devices 66.

Figure 6:
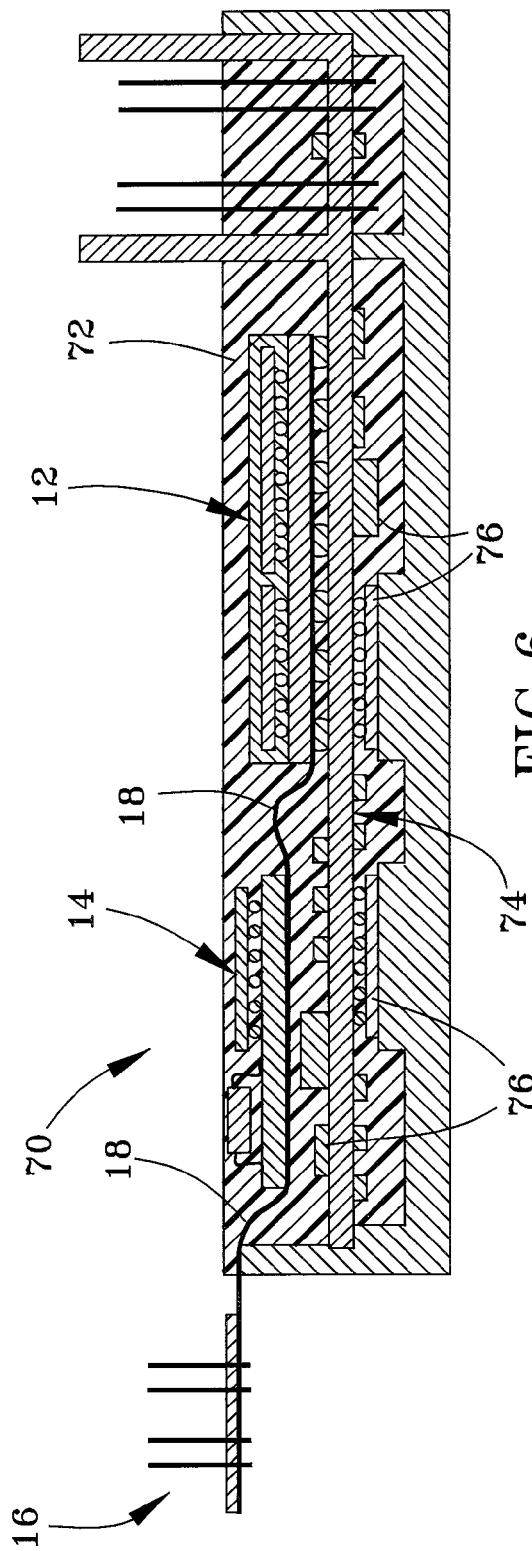
Figure 7:
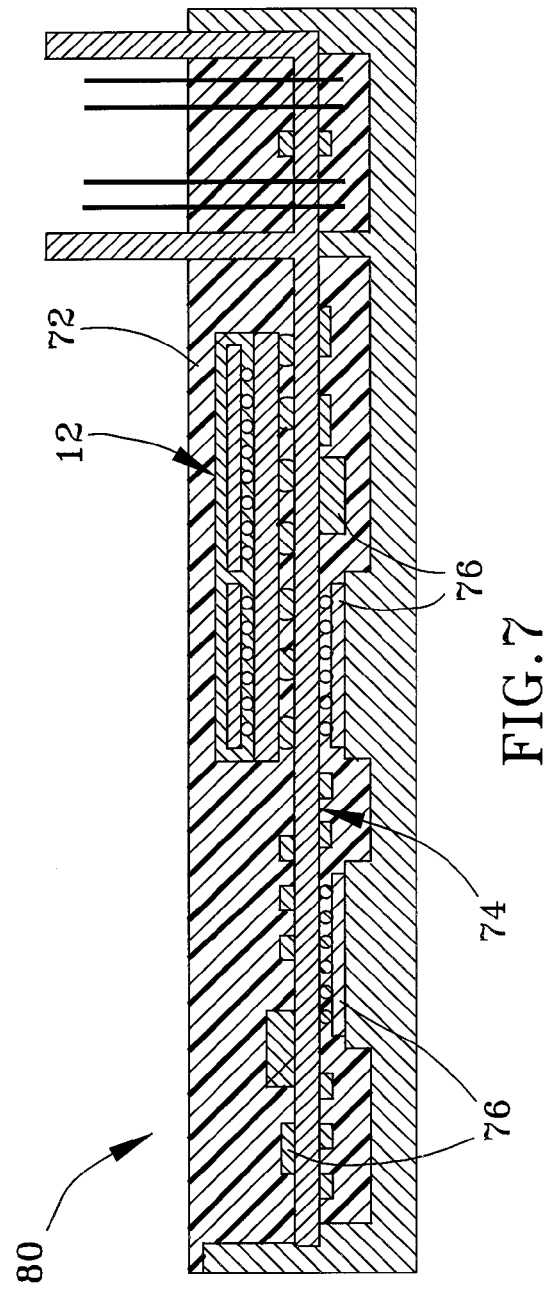
FIG. 7 shows a production unit of an overmolded electronic module corresponding to the developmental unit of FIG. 6, wherein the circuit unit present in the developmental unit is omitted from the production unit.

FIGS. 6 and 7 show developmental and production units 70 and 80, respectively, of a module that differs from the modules 40, 50 and 60 of FIGS. 3 through 5 as a result of the units 70 and 80 being overmolded instead of housed within a case. As seen in FIG. 6, the overmolding operation results in the motherboard 74, its devices 76, the MCM 12, the instrumentation unit 14 and a portion of the flexible circuit 18 being encased in an overmolding 72 that suspends the instrumentation module 14 above and apart from the motherboard 74 and its circuit devices 76. As also evident from FIGS. 6 and 7, the developmental and production units 70 and 80 of the module differ only by the absence of the instrumentation module 14, connector 16, and flexible circuit 18 in the production unit 80, such that both units 70 and 80 are able to be manufactured with identical motherboards 74.

While the invention has been described in terms of particular embodiments, it is apparent that other forms could be adopted by one skilled in the art. Accordingly, the scope of the invention is to be limited only by the following claims.

The invention claimed is:

1. A method of developing an electronic module comprising a motherboard and a multichip module mounted to the motherboard, the method comprising the steps of:
   providing a developmental unit of the electronic module, the developmental unit comprising the motherboard, the multichip module, and a circuit unit connected to the multichip module, the circuit unit comprising a flexible substrate, instrumentation circuitry required only in the developmental unit and mounted on the flexible substrate, and a connector coupled to the flexible substrate, the flexible substrate having signal lines that electrically communicate with the multichip module, the instrumentation circuitry, and the connector, a portion of the flexible substrate being between the multichip module and the motherboard and permitting electrical communication therebetween, the instrumentation circuitry not being mounted directly to the motherboard so as not to require space on the motherboard; and then
   producing a production unit of the electronic module by eliminating the circuit unit without altering the motherboard.

2. The method according to claim 1, wherein the step of providing the developmental unit comprises placing the motherboard, the multichip module, the flexible substrate, and the instrumentation circuitry in a housing, and mounting the instrumentation circuitry directly to the housing so as to be spaced apart from the motherboard.

3. The method according to claim 2, wherein the step of providing the developmental unit further comprises supporting the connector outside the housing with the flexible substrate.

4. The method according to claim 1, wherein the step of providing the developmental unit comprises mounting the instrumentation circuitry directly to the multichip module.

5. The method according to claim 4, wherein the step of providing the developmental unit further comprises placing the motherboard, the multichip module, the flexible substrate, and the instrumentation circuitry in a housing, and supporting the connector outside the housing with the flexible substrate.

6. The method according to claim 4, wherein the step of providing the developmental unit further comprises individually encasing the multichip module and the instrumentation circuitry in overmolded bodies.

7. The method according to claim 1, wherein the step of providing the developmental unit comprises placing the motherboard, the multichip module, the flexible substrate, and the instrumentation circuitry in a housing, and attaching a portion of the flexible substrate to the housing so that the instrumentation circuitry is spaced apart from the motherboard.

8. The method according to claim 7, wherein the step of providing the developmental unit further comprises supporting the connector outside the housing with the flexible substrate.

9. The method according to claim 1, wherein the step of providing the developmental unit further comprises encasing the motherboard, the multichip module, the flexible substrate, and the instrumentation circuitry in an overmolded body, the instrumentation circuitry being suspended within the overmolded body so as to be spaced apart from the motherboard, the connector projecting outside the overmolded body.

10. The method according to claim 1, wherein the step of providing the developmental unit comprises mounting the instrumentation circuitry to a printed circuit board and attaching the printed circuit board to the flexible substrate.

* * * * *